United States Patent [19]
Mori et al.

[11] Patent Number: 5,185,755
[45] Date of Patent: Feb. 9, 1993

[54] SEMICONDUCTOR LASER

[75] Inventors: Yoshihiro Mori; Masaya Mannoh; Satoshi Kamiyama; Kiyoshi Ohnaka, all of Osaka, Japan

[73] Assignee: Matsushita Electric Industrial Co., Ltd., Osaka, Japan

[21] Appl. No.: 756,016

[22] Filed: Sep. 6, 1991

[30] Foreign Application Priority Data

Sep. 7, 1990 [JP] Japan .................................. 2-237523

[51] Int. Cl.⁵ .............................................. H01S 3/19
[52] U.S. Cl. ........................................ 372/46; 372/45
[58] Field of Search .............................. 372/46, 44, 45

[56] References Cited

U.S. PATENT DOCUMENTS 5,036,521  7/1991  Hatakoshi et al. ..................... 372/46
5,058,120  10/1991  Nitta et al. ............................. 372/46

OTHER PUBLICATIONS

"Visible-Light" by Genichi Hatakoshi et al. Kogaku (Optics), vol. 19, pp. 362-368, 1990.

*Primary Examiner*—James W. Davie
*Attorney, Agent, or Firm*—Lowe, Price, LeBlanc & Becker

[57]  ABSTRACT

A semiconductor laser comprising an active waveguide formed of a compound semiconductor comprising a Group V element phosphorous, comprised of an active layer and two cladding layers that hold the active layer between them, and a current confinement structure formed on the active waveguide by the use of a compound semiconductor comprising Group V element arsenic. This semiconductor laser can achieve a small astigmatism, a low threshold current and a low operation current. Also disclosed is a method of fabricating a semiconductor laser having characteristic features that the crystal growth may be carried out only twice, the movement of the impurities in crystals does not easily occur, a regrowth interface with a very little defect can be readily obtained, and the structure wherein the outer cladding layer has a smaller width at its portion nearer to the active waveguide can be naturally formed.

11 Claims, 5 Drawing Sheets

SEMICONDUCTOR LASER

BACKGROUND OF THE INVENTION

1. Field of the Invention

This invention relates to a semiconductor laser used in optical signal processing or optical communications, and a method of fabricating the semiconductor laser.

2. Description of the Prior Art

FIG. 7 cross-sectionally illustrates the structure of a conventional semiconductor laser. Reference numeral 701 denotes a GaInP active layer, from which laser light of about 670 nm in wavelength is emitted. Reference numerals 702 and 703 each denote an AlGaInP cladding layer, having a function of confining the laser light to the GaInP active layer 701 and guiding it to an emitting facet. A structure having such a function is called a waveguide. These layers have a larger band gap width than the active layer, and hence at the same time have a function of confining injected carriers in the active layer. Reference numeral 704 denotes an n-type GaAs current blocking layer, which have two functions of preventing currents from passing through this layer and also absorbing the laser light, and, as a result, have a function of confining the laser light to the area beneath a ridge 709 to let the light guide therethrough. Namely, these form a waveguide structure which guides the laser light in the lateral direction. Reference numeral 705 denotes a p-type GaAs contact layer, which is in low-resistivity ohmic contact with a p-type electrode 707. A semiconductor multi-layer structure, comprised of these layers except the electrode 707, is formed on an n-type GaAs substrate 706 having the (100) plane on its surface. Reference numeral 708 denotes an n-type electrode, which is in low-resistivity ohmic contact with the n-type GaAs substrate 706 (see, for example, KOGAKU (Optics), Vol. 19, pp. 362-368, 1990).

Of these layers, the GaInP active layer 701 and the p-type and n-type AlGaInP cladding layers 702 and 703 are formed by first crystal growth, the n-type GaAs current blocking layer 704 by second crystal growth, and the p-type GaAs contact layer by third crystal growth.

In this device, the threshold current is 50 mA and the current needed to give a light output of 4 mW is 60 mA, at 25° C.

Fabricating the structure in which the laser light and current are laterally confined in this way brings about a uniform gain, and hence it can be expected that the wavefront of the laser light becomes flat and the astigmatism thereof becomes small. The gain is meant to be the degree to which the intensity of laser light is amplified when the laser light is guided. The wavefront of the laser light swiftly advances at the part where the gain is large. If the astigmatism is large, the spot formed when the light is focused can not be round, so that such laser light can not be readily used as a light source for optical disks.

In such a conventional structure, however, the ridge is in the form of a trapezoid wherein the upside is short, and hence electric currents are laterally spread while they flow from the upside to the active layer 701. As a result, the gain in the active layer 701 becomes gradually smaller toward the base end of the ridge 709. Hence, the wavefront of the laser light swiftly advances at the middle of the ridge, where the astigmatism is enlarged. Thus such laser light can not be readily used as a light source for optical disks.

The n-type GaAs current blocking layer 704 absorbs the laser light and hence has a large guiding loss. The guiding loss is meant to be a loss the laser light may undergo because of absorption or scattering during its passing through the waveguide. This results in an increase in threshold currents or operation currents.

The p-type AlGaInP cladding layer 702 is so high in both resistivity and thermal resistivity that it has been difficult to attain operation at high temperatures or operation in a low droop. The droop is meant to be a gradual decrease in light intensity in one pulse amplitude that may be caused by a decrease in emission efficiency due to heat generation, at the time of pulsed operation.

The prior art structure also requires carrying out crystal growth three times. In the course of such crystal growth, the structure is heated to a high temperature of 600° C. to 700° C., so that impurities such as zinc present in crystals may move outside the layer because of their diffusion or the like. This may cause an increase in resistivity of the device or result in a poor efficiency for the confinement of carriers to the active layer, tending to bring about a deterioration of characteristics such as threshold currents, high-temperature operation and low-droop operation.

SUMMARY OF THE INVENTION

An object of the present invention is to provide a device structure that can solve all the first, second, third and fourth problems as discussed above and a device structure that can solve the first, third and fourth problems.

Another object of the present invention is to provide a method of fabricating a semiconductor laser, that can accomplish such device structures.

A first device structure according to the present invention comprises a structure comprising an active waveguide formed of a compound semiconductor comprising a Group V element phosphorus, comprised of an active layer and two cladding layers that hold the active layer between them, and a current confinement structure formed on the active waveguide by the use of a compound semiconductor comprising Group V element arsenic; wherein the current confinement structure has at least a stripelike conduction layer, a current blocking layer that holds both sides of the stripelike conduction layer and a thin-film layer formed beneath them in a layer thickness small enough not to affect the waveguide performance of the active waveguide, the conduction layer has at the same time a function as an outer cladding layer and has a width made narrower toward the active waveguide, and the current blocking layer has a smaller refractive index than the conduction layer.

A second device structure according to the present invention comprises a structure comprising an active waveguide formed of a compound semiconductor comprising a Group V element phosphorus, comprised of an active layer and two cladding layers that hold the active layer between them, and a current confinement structure formed on the active waveguide by the use of a compound semiconductor comprising Group V element arsenic; wherein the current confinement structure has at least a stripelike conduction layer, a current blocking layer that holds both sides of the stripelike conduction layer and a thin-film layer formed beneath them in a layer thickness small enough not to affect the waveguide performance of the active waveguide, the conduction layer has at the same time a function as an outer cladding layer and has a width made narrower toward the active waveguide, and the current blocking layer has the same band gap as, or a smaller band gap than, the photon energy of emitted laser light.

A first fabricating method according to the present invention comprises successively growing an active waveguide comprised of a compound semiconductor comprising a Group V element phosphorus, a thin-film layer comprised of a first-conductivity type compound semiconductor comprising Group V element arsenic and a current blocking layer comprised of a second-conductivity type compound semiconductor, thereafter selectively etching only the current blocking layer in the form of a stripe using an etching mask formed thereon, subsequently buffer-etching only the current blocking layer after removing the etching mask, to remove a damaged region on its surface, and then carrying out crystal growth to form thereon an outer cladding layer comprising Group V element arsenic.

A second fabricating method according to the present invention comprises successively growing an active waveguide formed of a compound semiconductor comprising a Group V element phosphorus, a thin-film layer formed of a first-conductivity type compound semiconductor comprising Group V element arsenic, a current blocking layer formed of a second-conductivity type compound semiconductor, a compound semiconductor protective layer and a compound semiconductor mask layer, thereafter selectively etching only the compound semiconductor mask layer in the form of a stripe using an etching mask formed thereon, subsequently etching only the compound semiconductor protective layer using the compound semiconductor mask layer as a mask after removing the etching mask, thereafter simultaneously etching only the uncovered portion of the current blocking layer and the compound semiconductor mask layer, and then carrying out crystal growth to form thereon an outer cladding layer comprising Group V element arsenic.

According to the first device structure of the present invention, since the outer cladding layer is made narrower at its portion nearer to the active waveguide, there can be no lateral spread of currents which has occurred in the prior art. Thus, the currents can be uniformely injected into the active layer. This can bring about a flat wavefront and a small astigmatism. In addition, since the current blocking layer has a smaller refractive index than the outer cladding layer, a lateral waveguide structure with a very small waveguide loss can be readily fabricated and also the threshold current or operation current can be decreased. Moreover, a material that is small in both resistivity and thermal resistivity can be used in the outer cladding layer, and hence it is possible to prevent device temperature from rising.

The second device structure can obtain the effect that it is possible to attain a small astigmatism and prevent device temperature from rising, for the same reason aa the above. As for the guiding loss, it can not be made so much smaller than that is the first device structure, but the content of aluminum (Al) in thecurrent blocking layer can be made smaller than that in the first device structure. Hence, the second device structure can also bring about the effect that the current blocking layer can be less oxidized on its surface at the time of the second crystal growth and can be more readily grown.

According to the first fabricating method of the present invention, the crystal growth may be carried out only twice, and hence the movement of the impurities in crystal dose not easily occur. In addition, since the thin-film layer is not etched when the current blocking layer is buffer-etched, the active waveguide layer can be protected from the etchant. Moreover, since the Group V element of the layer having been uncovered when the second crystal growth is carried out is the same as the Group V element of the outer cladding layer, a regrowth interface (herein an interface between layers formed by repeated crystal growth) with a very little defect can be readily obtained. Furthermore, since the sides of a groove in the current blocking layer can be readily made outwards sloping, uniform crystal growth can be readily carried out on the surface in the second crystal growth and at the same time the structure wherein the outer cladding layer has a smaller width at its portion nearer to the active waveguide can be naturally formed.

The second fabricating method of the present invention can obtain, for the same reason as the above, the effect that the movement of the impurities in crystals dose not easily occur, the active waveguide layer can be protected from the etchant, a regrowth interface with a very little defect can be readily obtained, uniform crystal growth can be readily carried out on the surface inthe second crystal growth, and the structure wherein the outer cladding layer has a smaller width at its portion nearer to the active waveguide can be naturally formed. In addition, since the compound semiconductor protective layer is not etched even when the compound semiconductor mask layer and the current blocking layer are etched, the form of the current blocking layer can be determined accordingly. Since also the content of Al in the compound semiconductor protective layer can be made smaller than that in the current blocking layer, the second fabricating method can also bring about the effect that the current bocking layer can be less oxidized on its surface at the time of the second crystal growth and can be more readily grown.

BREIF DESCRIPTION OF THE DRAWINGS

DESCRIPTION OF THE PREFERRED EMBODIMENTS

Figure 1:
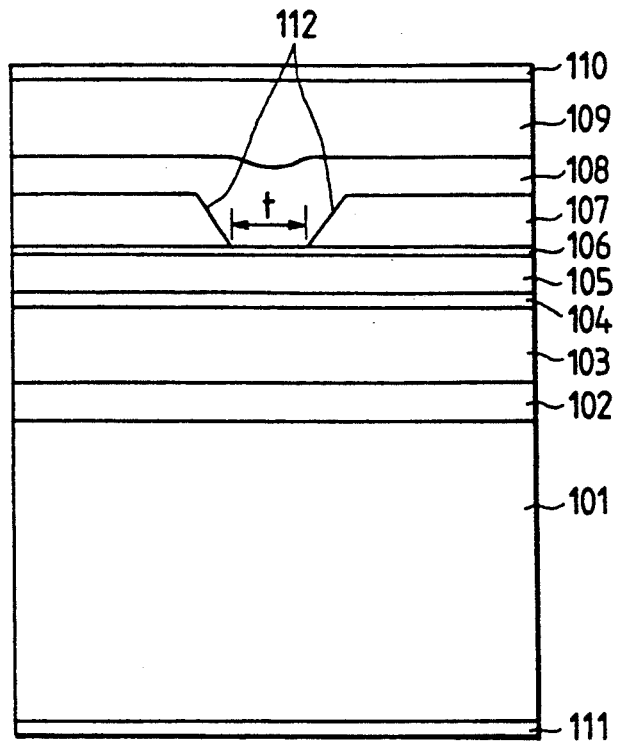
FIG. 1 is a cross section to illustrate the structure of a first embodiment of the first device structure of the semiconductor laser according to the present invention.

FIG. 1 cross-sectionally illustrates a first embodiment of the first device structure of the semiconductor laser according to the present invention. Reference numeral 101 denotes as n-type GaAs substrate; and 102, an n-type GaAs buffer layer of 0.5 micron thick. Reference numerals 103, 104 and 105 denote an n-type AlGaInP cladding layer of 1 micron thick, a GaInP active layer of 0.06 micron thick and a p-type AlGaInP cladding layer of 0.3 micron thick, respectively. These three layers constitute an active waveguide. Reference numeral 106 denotes a p-type GaAs thin-film layer of 0.01 micron thick; 107, an n-type AlGaAs current blocking layer of 0.7 micron thick; 108, a p-type AlGaInP outer cladding layer of 1 micron thick; and 109, a GaAs contact layer of 3 micron thick. Reference numerals 110 and 111 denote a p-type electrode comprised of an alloy of Au and Zn and an n-type electrode comprised of an alloy of Au and Ge, respectively, which can obtain a low ohmic contact with respect to the p-type and n-type GaAs's, respectively. Sides 112 of a groove in the n-type AlGaAs current blocking layer are outwards sloping, i.e., in the state that upward normals of the sides 112 are always inclined in outward directions. A stripe width t at the bottom is about 3 microns.

The p-type AlGaInP outer cladding layer 108 (a conduction layer) may have composition represented by the formula $Al_{x1}Ga_{1-x1}As$ ($0 \leq x1 \leq 1$); the n-type AlGaAs current blocking layer 107, composition represented by the formula $Al_{y1}Ga_{1-y1}As$ ($0 \leq y1 \leq 1$); and the p-type GaAs thin-film layer 106, composition represented by the formula $Al_{z1}Ga_{1-z1}As$ ($0 \leq z1 \leq 1$).

The GaInP active layer 104 emits red laser light with a wavelength of about 670 nm. With respect to this wavelength, the GaInP active layer 104 has a refractive index of about 3.6 and the AlGaInP cladding layers 103 and 105 each have a refractive index of about 3.3. The p-type AlGaInP outer cladding layer 108 is made to have substantially the same refractive index as, or a smaller refractive index than, that of the p-type AlGaInP cladding layer 105. More specifically, the refractive index of AlGaAs is substantially 3.3 when composition x1 of Al in the outer cladding layer 108 is about 0.6, and gradually decreases with an increase in x1. The refractive index of the current blocking layer 107 is set smaller than that of the outer cladding layer 108. In other words, composition y1 of Al in the current blocking layer 107 is larger than x1. When a difference in the refractive index is larger than about 0.1, particularly good waveguide characteristics can be obtained. In order to obtain such a difference in refractive index, y1 must be made larger than x1 by about 0.2. Accordingly, x1 should be in a value of 0.6 to 0.8 ($0.6 \leq x1 \leq 0.8$), and y1, a value of 0.8 to 1.0 ($0.8 \leq x1 \leq 1.0$). Under such composition, the band gap is larger than the energy of laser light, and hence the laser light can not be absorbed. Operation and advantages of this device will be described below.

To this semiconductor laser, a current is flowed from the p-type electrode 110 to the n-type electrode 111. As a result, holes flow from the GaAs contact layer 109 to the p-type AlGaInP outer cladding layer 108. However, the pn junction between the n-type AlGaAs blocking layer 107 and the p-type GaAs thin-film layer 106 is brought into a reverse bias, and hence no current flows here. The current instead passes through the part held between the two outwards sloping sides 112, so that the current can be gradually narrowed down. This part has a resistivity and a thermal resistivity that are sufficiently lower than the AlGaInP layers, and hence the heat can be less generated and any heat once generated can be quickly dissipated. Since the p-type AlGaInP cladding layer 105 has a small thickness, the current injected here is little spread and immediately injected into the GaInP active layer 104. Thus, the wavefront of the laser light can be flat. The laser light is also spreading guided through the p-type AlGaInP outer cladding layer 108 and the n-type AlGaAs current blocking layer 107. Since, as previously stated, the former has a higher refractive index than the latter, an average refractive index the laser light may feel in the lateral direction becomes higher at the part where the former is present, and the laser light is guided mainly in confinement to this part and the active waveguide positioned right beneath it. The laser light may also be spread to the p-type GaAs thin-film layer 106. The GaAs thin-film layer 106 has a high refractive index and also absorbs this laser light, but has a thickness made as small as 0.01 micron. Hence it little affects the guiding of the laser light. Therefore the guiding loss due to the absorption little occurs in this structure, so that it becomes possible to decrease the threshold currents or operation currents.

Figure 2:
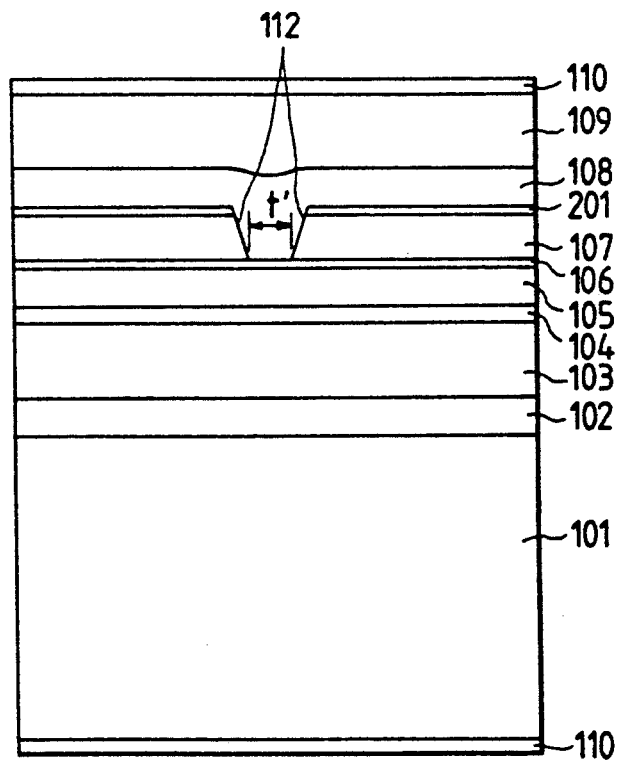
FIG. 2 is a cross section to illustrate the structure of a second embodiment of the first device structure of the semiconductor laser according to the present invention.

FIG. 2 cross-sectionally illustrates a second embodiment of the first device structure of the semiconductor laser according to the present invention. The layers denoted by reference numerals common to those in FIG. 1 are composed of the same materials. What is different is that the structure has an n-type GaAs protective layer 201. This n-type GaAs protective layer may have composition represented by $Al_{z1}Ga_{1-z1}As$ ($0 \leq z1 \leq 1$). Although the presence of this layer results in an increase in the number of layers, the form of the outwards sloping sides 112 can be more delicately controlled because of the advantages on the fabrication as stated later. As a result, it is readily possible to more narrow a width t' than the width t in FIG. 1. It therefore becomes possible to more decrease the threshold currents or operation currents. Other performances and advantages are the same as those in the first embodiment.

Figure 3:
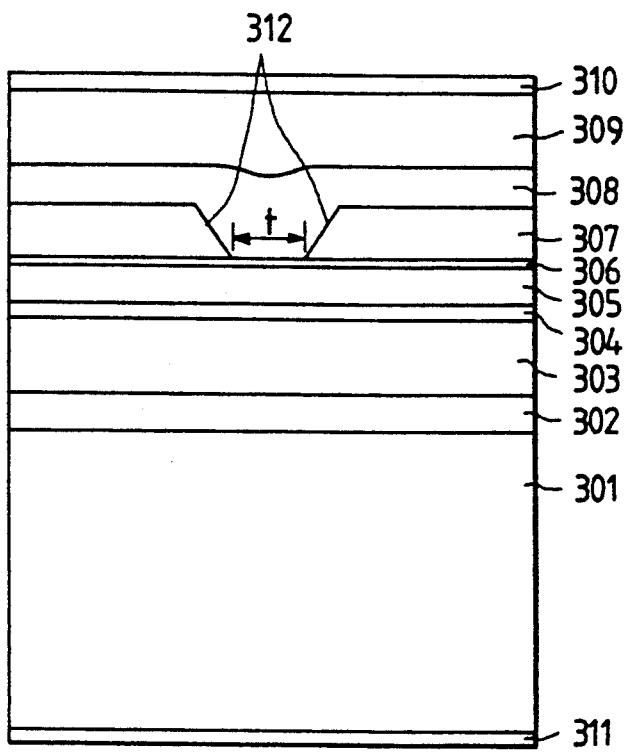
FIG. 3 is a cross section to illustrate the structure of a first embodiment of the second device structure of the semiconductor laser according to the present invention.

FIG. 3 cross-sectionally illustrates a first embodiment of the second device structure of the semiconductor laser according to the present invention. Reference numeral 301 denotes an n-type GaAs substrate; and 302, an n-type GaAs buffer layer of 0.5 micron thick. Reference numerals 303, 304 and 305 denote an n-type AlGaInP cladding layer of 1 micron thick, a GaInP active layer of 0.06 micron thick and a p-type AlGaInP cladding layer of 0.3 micron thick, respectively. These three layers constitute an active waveguide. Reference numeral 306 denotes a p-type GaAs thin-film layer of 0.01 micron thick; 307, an n-type AlGaAs current blocking layer of 0.7 micron thick; 308, a p-type AlGaInP outer cladding layer of 1 micron thick; and 309, a GaAs contact layer of 3 microns thick. Reference numerals 310 and 311 denote a p-type electrode comprised of an alloy of Au and Zn and an n-type electrode comprised of an alloy of Au and Ge, respectively. Sides 312 of a groove in the n-type AlGaAs current blocking layer are outwards sloping. A stripe width t at the bottom is about 4 microns.

The p-type AlGaInP outer cladding layer 308 (a conduction layer) may have composition represented by the formula $Al_{x2}Ga_{1-x2}As$ ($0 \leq x2 \leq 1$); the n-type AlGaAs current blocking layer 307, composition represented by the formula $Al_{y2}Ga_{1-y2}As$ ($0 \leq y2 \leq 1$); and the p-type GaAs thin-film layer 306, composition represented by the formula $Al_{z2}Ga_{1-z2}As$ ($0 \leq z2 \leq 1$).

The GaInP active layer 304 emits red laser light with a wavelength of about 670 nm. With respect to this wavelength, the GaInP active layer 304 has a refractive index of about 3.6 and the AlGaInP cladding layers 303 and 305 each have a refractive index of about 3.3. The p-type AlGaInP outer cladding layer 308 is made to have substantially the same refractive index as, or a smaller refractive index than, that of the p-type AlGaInP cladding layer 305. More specifically, composition x2 of Al in the outer cladding layer 308 is made to be not less than 0.6. Under such composition, the band gap is larger than the energy of laser light, and hence the laser light can not be absorbed. More specifically, this occurs when composition y2 of Al in the current blocking layer 307 is not more than about 0.3. When this layer has such a low Al composition, the surface of this layer is not easily oxidized, so that it becomes very easy to carry out the second crystal growth. Operation and advantages of this device will be described below.

To this semiconductor laser, a current is flowed from the p-type electrode 310 to the n-type electrode 311. As a result, holes flow from the GaAs contact layer 309 to the p-type AlGaInP outer cladding layer 308. However, the pn junction between the n-type AlGaAs current blocking layer 307 and the p-type GaAs thin-film layer 306 is brought into a reverse bias, and hence no current flows here. The current instead passes through the part held between the two outwards sloping sides 312, so that the current can be gradually narrowed down. This part has a resistivity and a thermal resistivity that are sufficiently lower than the AlGaInP layers, and hence the heat can be less generated and any heat once generated can be quickly dissipated. Since the p-type AlGaInP cladding layer 305 has a small thickness, the current injected here is little spread and immediately injected into the GaInP active layer 304. Thus, the wavefront of the laser light can be flat. The laser light is also spreadingly guided through the p-type AlGaInP outer cladding layer 308 and the n-type AlGaAs current blocking layer 307. Since, as previously stated, the n-type AlGaAs current blocking layer absorbs the laser light, the laser light is guided mainly through p-type AlGaInP outer cladding layer 308 and the active waveguide positioned right beneath it. The laser light may also be spread to the p-type GaAs thin-film layer 306. The GaAs thin-film layer 306 has a high refractive index and also absorbs this laser light, but has a thickness made as small as 0.01 micron. Hence it little affects the guiding of the laser light. In this structure, the width t through which the current is injected can be made smaller than that in the prior art, and hence it become possible to decrease the threshold currents or operation currents.

Figure 4:
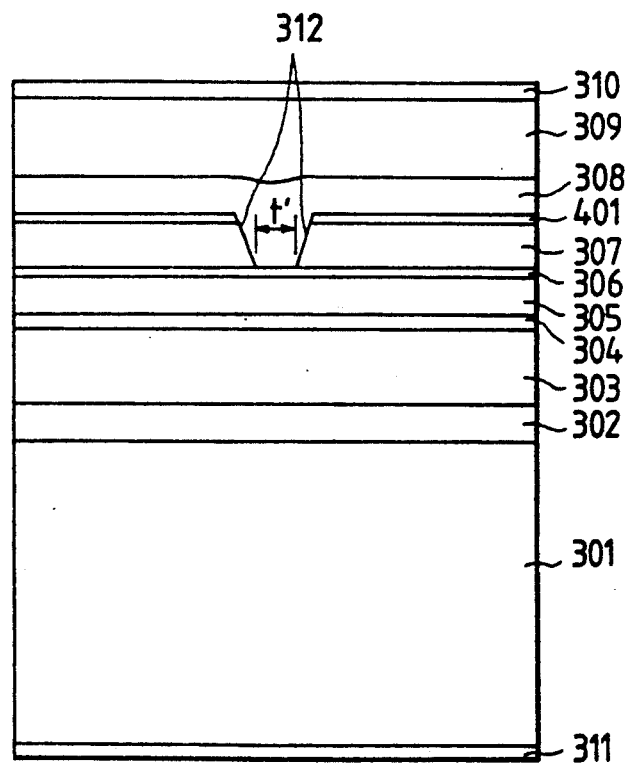
FIG. 4 is a cross section to illustrate the structure of the second embodiment of the second device structure of the semiconductor laser according to the present invention.

FIG. 4 cross-sectionally illustrates a second embodiment of the second device structure of the semiconductor laser according to the present invention. The layers denoted by reference numerals common to those in FIG. 1 are composed of the same materials. What is different is that the structure has an n-type GaAs protective layer 401. This n-type GaAs protective layer 401 may have composition represented by $Al_{z2}Ga_{1-z2}As$ ($0 \leq z2 \leq 1$). Although the presence of this layer results in an increase in the number of layers, the form of the outwards sloping sides 312 can be more delicately controlled because of the advantages on the fabrication as stated later. As a result, it is readily possible to more narrow a width t' than the width t in FIG. 3. It therefore becomes possible to more decrease the threshold currents or operation currents. Other performances and advantages are the same as those in the fist embodiment.

Figure 5A:
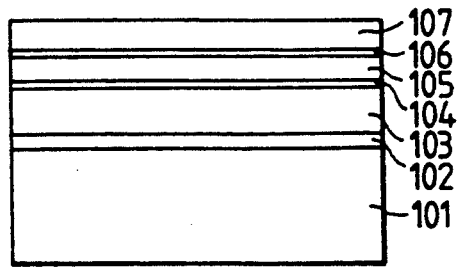
FIGS. 5A to 5D are cross sections to stepwise illustrate the first method of fabricating the semiconductor laser according to the present invention.
Figure 5B:
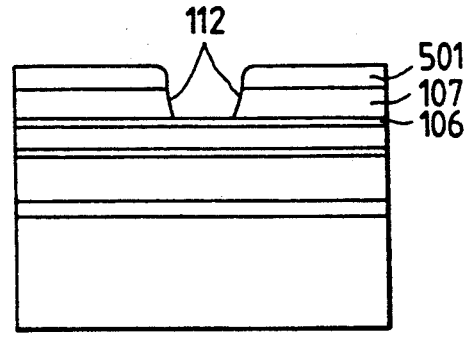
Figure 5C:
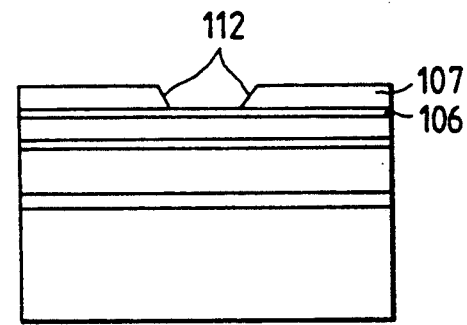
Figure 5D:
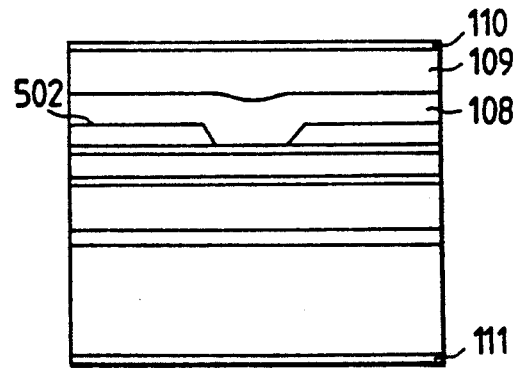

FIGS. 5A to 5D are cross sections to stepwise illustrate the first method of fabricating the semiconductor laser according to the present invention. As an example, the procedure of preparing the device shown in FIG. 1 is shown there. The layers denoted by reference numerals common to those in FIG. 1 are composed of the same materials. FIG. 5A shows a state in which first crystal growth has been completed. The crystal growth is carried out by metal-organic vapor phase epitaxy. Next, a photoresist 501 is coated on the surface. The photoresist is selectively removed by photolithography in the form of a stripe with a width of 3 microns. Using this photoresist as an etching mask, the n-type AlGaAs current blocking layer 107 is selectively etched with hydrofluoric acid. As a result, a groove with outwards sloping sides 112 is formed. The hydrofluoric acid has so low an etching speed on GaAs or AlGaAs with a small Al content (z1) that it can be used as an etchant for selectively etching the AlGaAs with a large Al content. In particular, the selective etching becomes very easy when the Al content z1 is smaller than 0.3. Hence, the p-type GaAs thin-film layer 106 is not etched with hydrofluoric acid. This state is shown in FIG. 5B. Next, after the photoresist has been removed using acetone, the surface of the n-type AlGaAs current blocking layer 107 is etched with hydrofluoric acid for a short time. This etching is called buffer etching, which is carried out for the purpose of preventing good second crystal growth from being obstructed by surface defects or stains produced as a result of exposure to the air or formation of the photoresist layer. This buffer etching makes the width of a groove a little larger to give the width of about 3 microns. At this stage also, the p-type GaAs thin-film layer 106 is not etched with the hydrofluoric acid. This state is shown in FIG. 5C. Next, the second crystal growth is carried out thereon. Since the planes on which the crystal growth is effected are comprised of AlGaAs and GaAs in which Group V element is only As, arsine may only be introduced in order to prevent the Group V element from escaping from the layers to the gaseous phase in the course of temperature rise. The arsine is successively continued flowing also when the p-type AlGaInP outer cladding layer 108 is grown, so that a good regrowth interface 502 can be obtained without any interruption of the starting material gas flow. In addition, since the terraces on the surface have outwards sloping sides 112 only, uniform crystal growth can be effected because of presence of no surfaces or corners that may cause a difficulty in carrying out the crystal growth, so that the p-type AlGaInP outer cladding layer 108 and the p-type contact layer 109 can be readily formed. Thereafter, the p-type electrode 110 is formed by vacuum deposition. After the back surface of the n-type GaAs substrate 101 has been abraded to give a thickness of about 100 microns, the n-type electrode 111 is further formed by vacuum deposition, followed by convertion of these electrodes into alloys at about 400° C. to complete the process. This state is shown in FIG. 5D.

Characteristic features of the above first method of fabricating the semiconductor laser of the present invention can be summarize as follows: The crystal growth may be carried out only twice, and hence the movement of the impurities in crystals does not easily occur; the thin-film layer can protect the active waveguide layer from the etchant; a regrowth interface with a very little defect can be readily obtained; since the sides of the groove in the current blocking layer can be readily made outwards sloping, uniform crystal growth can be readily carried out on the surface in the second crystal growth; and the structure wherein the outer cladding layer has a smaller width at its portion nearer to the active waveguide can be naturally formed. Needless to say, the first method of fabricating the semiconductor laser of the present invention as described above can be also applied to the case when the device shown in FIG. 3 is fabricated.

Figure 6A:
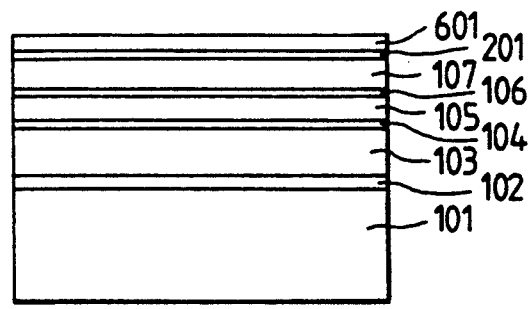
FIGS. 6A to 6D are cross sections to stepwise illustrate the second method of fabricating the semiconductor laser according to the present invention.
Figure 6B:
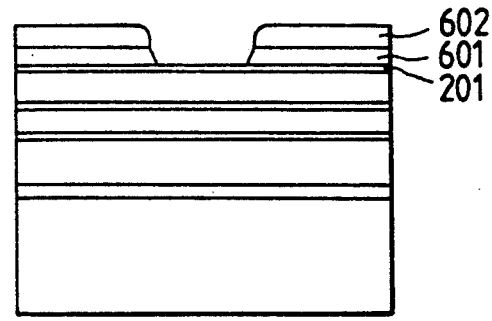
Figure 6C:
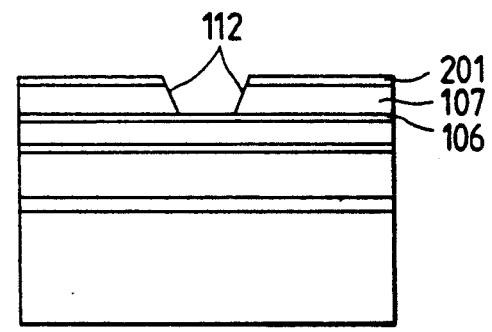
Figure 6D:
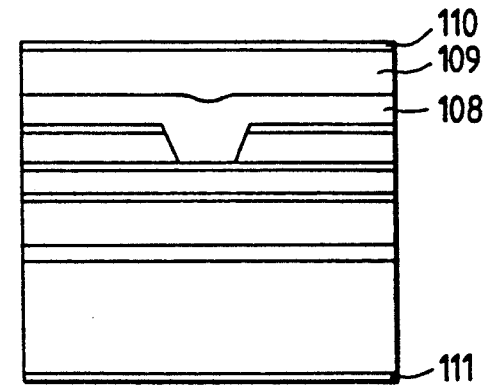
Figure 7:
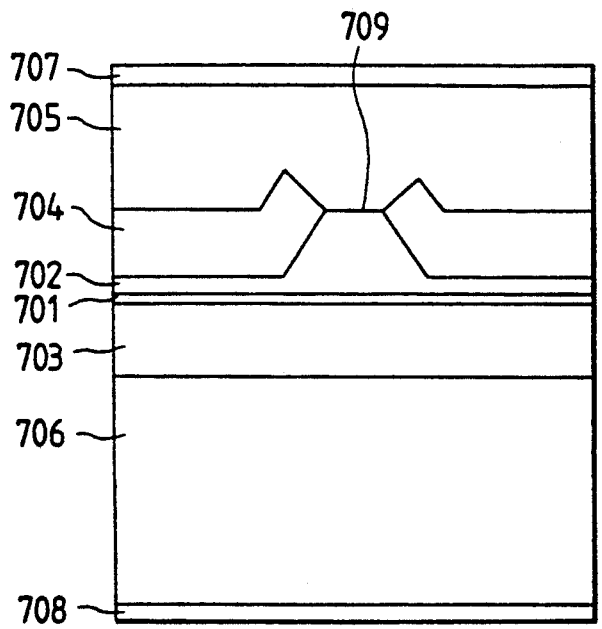
FIG. 7 is a cross section to illustrate the structure of a conventional semiconductor laser.

FIGS. 6A to 6D are cross sections to stepwise illustrate the second method of fabricating the semiconductor laser according to the present invention. As an example, the procedure of preparing the device shown in FIG. 2 is shown there. The layers denoted by reference numerals common to those in FIG. 2 are composed of the same materials. FIG. 6A shows a state in which first crystal growth has been completed. The crystal growth is carried out by metal-organic vapor phase epitaxy. Reference numeral 601 denotes a mask layer comprised of AlGaAs with an Al content relatively as high as 0.7. Next, a photoresist 602 is coated on the surface. The photoresist is selectively removed by photolithography in the form of a stripe with a width of 3 microns. Using this photoresist as an etching mask, the mask layer 601 is selectively etched with hydrofluoric acid. At this time, the n-type GaAs protective layer 201 is not etched with hydrofluoric acid. This state is shown in FIG. 6B. Next, after the photoresist 602 has been removed using acetone, the uncovered part of the n-type GaAs protective layer 201 is etched using the mask layer 601 as an etching mask. As an etchant, a selective etchant is used which is capable of selectively etching GaAs or AlGaAs with a small Al content, as exemplified by a solution comprising a mixture of liquid ammonia and oxygenated water. Next, the n-type AlGaAs current blocking layer 107 and the mask layer 601 are simultaneously etched with hydrofluoric acid. As a result, a groove with outwards sloping sides 112 is formed in the n-type AlGaAs current blocking layer 107. Since the Al content in the mask layer 601 is sufficiently higher than that in the n-type GaAs protective layer 201, the mask layer 601 can be completely removed without etching of the n-type GaAs protective layer 201. This removal of the mask layer 601 can bring about removal of surface defects or stains produced as a result of exposure to the air or formation of the photoresist layer, and hence the second crystal growth can be carried out in a good state. This selective etching does not broaden at all the width of the groove, and hence a groove with a smaller width than that in the first fabricating method can be formed. In the case of this example, the groove is formed in a width of about 2 microns. At this stage also, the p-type GaAs thin-film layer 106 is not etched with the hydrofluoric acid. This state is shown in FIG. 6C. Next, the second crystal growth is carried out thereon. Since the planes on which the crystal growth is effected are comprised of AlGaAs and GaAs in which Group V element is only As, arsine may only be introduced in order to prevent the Group V element from escaping from the layers to the gaseous phase in the course of temperature rise. The arsine is successively continued flowing also when the p-type AlGaInP outer cladding layer 108 is grown, so that a good regrowth interface 502 can be obtained without any interruption of the starting material gas flow. In addition, since the terraces on the surface have outwards sloping sides 112 only, uniform crystal growth can be effected because of presence of no surfaces or corners that may cause a difficulty in carrying out the crystal growth, so that the p-type AlGaInP outer cladding layer 108 and the p-type contact layer 109 can be readily formed. Moreover, since almost the whole surface is covered with the n-type GaAs protective layer 201 that can not be easily oxidized, good crystal growth can be effected without taking any particular care to oxidation. Thereafter, the p-type electrode 110 is formed by vacuum deposition. After the back surface of the n-type GaAs substrate 101 has been abraded to give a thickness of about 100 microns, the n-type electrode 111 is further formed by vacuum deposition, followed by cenversion of these electrodes into alloys at about 400° C. to complete the process. This state is shown in FIG. 6D.

Characteristic features of the above second method of fabricating the semiconductor laser of the present invention can be summarize as follows: The semiconductor laser protective layer makes the surface oxidation not easily occur in the course of crystal growth and also makes it possible to form a narrow groove in the current blocking layer in a good controllability; the movement of the impurities in crystals does not easily occur; the active waveguide layer can be protected from the etchant; a regrowth interface with a very little defect can be readily obtained; uniform crystal growth can be readily carried out on the surface in the second crystal growth; and the structure wherein the outer cladding layer has a smaller width at its portion nearer to the active waveguide can be naturally formed. Needless to say, the second method of fabricating the semiconductor laser of the present invention as described above can be also applied to the case when the device shown in FIG. 4 is fabricated.

Stated additionally, in the devices or methods as shown in FIGS. 1 to 6, there is no problem if the active layer is made to comprise an AlGaInP layer, a laminated structure comprised of thin films of AlGaInp and GaInp, or a laminated structure comprised of two or more kinds of AlGaInP thin films. There is also no problem if the n-type and p-type AlGaInP cladding layers have composition different from each other. It is also possible to carry out the same selective etching without any problem even when AlGaAs with a low Al content is used in the thin-film layer. The crystal growth also is not necessarily be limited to the metal-organic vapor phase epitaxy, and there is no problem if other crystal growth process such as molecular beam epitaxy is used. In the first device structure, the current blocking layer is not necessarily comprised of AlGaAs, where the same effect can be obtained and also the same fabrication method can be applied if it is comprised of AlAs. The protective layer is also not necessarily be of n-type, and may be of p-type without any problem.

According to the present invention, it is possible to achieve a small astigmatism, a low threshold current and a low operation current, so that it is possible to readily fabricate a semiconductor laser having also the features that it can attain operation at high temperatures or operation in a low droop.

It is also possible to readily fabricate a semiconductor laser having the characteristic features that the crystal growth may be carried out only twice, the movement of the impurities in crystals does not easily occur, a re-growth interface with a very little defect can be readily obtained, and the structure wherein the outer cladding layer has a smaller width at its portion nearer to the active waveguide can be naturally formed.

What is claimed is:

1. A semiconductor laser comprising:
   an active waveguide comprised of a compound semiconductor comprising a Group V element phosphorus;
   a thin-film layer comprised of a first-conductivity type compound semiconductor comprising a Group V element arsenic, formed in contact with a main surface of said active waveguide;
   a current blocking layer comprised of a second-conductivity type compound semiconductor comprising a Group V element arsenic, formed on said thin-film layer to have outwards sloping sides, said outward sloping sides forming a groove exposing a portion of said thin-film layer as a strip with a given width; and
   an outer cladding layer comprised of a first-conductivity type compound semiconductor comprising a Group V element arsenic and having a larger refractive index than said current blocking layer, formed on said current blocking layer and said thin-film layer.

2. A semiconductor laser according to claim 1, wherein said active layer comprises a laminated structure comprised of an AlGaInP layer and a GaInP layer, or a laminated structure comprised of two or more kinds of AlGaInP layers.

3. A semiconductor laser according to claim 1, wherein said outer cladding layer has composition represented by the formula $Al_{x1}Ga_{1-x1}As$ ($0 \leq x1 \leq 1$); said current blocking layer, composition represented by the formula $Al_{y1}Ga_{1-y1}As$ ($0 \leq y1 \leq 1$); and said thin-film layer, composition represented by the formula $Al_{z1}Ga_{1-z1}As$ ($0 \leq z1 \leq 1$).

4. A semiconductor laser according to claim 3, wherein x1 is 0.6 to 0.8, y1 is 0.8 to 1 and z is 0.

5. A semiconductor laser according to claim 1, wherein a protective layer comprised of a semiconductor laser comprising a Group V element arsenic is formed between the main surface of said current blocking layer and said outer cladding layer.

6. A semiconductor laser according to claim 5, wherein said protective layer has composition represented by $Al_{z1}Ga_{1-z1}As$ ($0 \leq z1 \leq 1$).

7. A semiconductor laser comprising:
   an active waveguide comprised of a compound semiconductor comprising a Group V element phosphorus;
   a thin-film layer comprised of a first-conductivity type compound semiconductor comprising a Group V element arsenic, formed in contact with a main surface of said active waveguide;
   a current blocking layer comprised of a second-conductivity type compound semiconductor comprising a Group V element arsenic and having the same band gap as, or a smaller band gap than, the photon energy of emitted laser light, formed on said thin-film layer to have outwards sloping sides, said outward sloping sides forming a groove exposing a portion of said thin-film layer as a strip with a given width; and
   an outer cladding layer comprised of a first-conductivity type compound semiconductor comprising a Group V element arsenic, formed on said current blocking layer and said thin-film layer.

8. A semiconductor laser according to claim 7, wherein said active layer comprises a laminated structure comprised of an AlGaInP layer and a GaInP layer, or a laminated structure comprised of two or more kinds of AlGaInP layers.

9. A semiconductor laser according to claim 7, wherein said outer cladding layer has composition represented by the formula $Al_{x2}Ga_{1-x2}As$ ($0.6 \leq x2 \leq 1$); said current blocking layer, composition represented by the formula $Al_{y2}Ga_{1-y2}As$ ($0 \leq y2 \leq 0.3$); and said thin-film layer, composition represented by the formula GaAs.

10. A semiconductor laser according to claim 7, wherein a protective layer comprised of a semiconductor layer comprising a Group V element arsenic is formed between the main surface of said current blocking layer and said outer cladding layer.

11. A semiconductor laser according to claim 10, wherein said protective layer has composition represented by $Al_{z2}Ga_{1-z2}As$ ($0 \leq z2 \leq 1$).

* * * * *